US012764972B2

(12) United States Patent
Wu et al.

(10) Patent No.: US 12,764,972 B2
(45) Date of Patent: Oct. 13, 2026

(54) MEMORY DEVICE AND METHOD OF FORMING THE SAME

(71) Applicant: Taiwan Semiconductor Manufacturing Company, Ltd., Hsinchu (TW)

(72) Inventors: Cheng-Hsien Wu, Hsinchu City (TW); Chen-Feng Hsu, Hsinchu (TW); Chien-Min Lee, Hsinchu County (TW); Tung-Ying Lee, Hsinchu City (TW); Xinyu Bao, Fremont, CA (US); Elia Ambrosi, Hsinchu City (TW); Hengyuan Lee, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 744 days.

(21) Appl. No.: 18/152,770

(22) Filed: Jan. 11, 2023

(65) Prior Publication Data

US 2024/0040802 A1 Feb. 1, 2024

Related U.S. Application Data

(60) Provisional application No. 63/419,714, filed on Oct. 27, 2022, provisional application No. 63/392,492, filed on Jul. 26, 2022.

(51) Int. Cl.
*H10B 63/00* (2023.01)

(52) U.S. Cl.
CPC ............. *H10B 63/20* (2023.02); *H10B 63/30* (2023.02)

(58) Field of Classification Search
CPC ....................................................... H10B 63/20
See application file for complete search history.

(56) References Cited

U.S. PATENT DOCUMENTS

| | | | | |
|---|---|---|---|---|
| 11,349,070 | B2 * | 5/2022 | Wu | H10N 70/021 |
| 2013/0048935 | A1 * | 2/2013 | Gotti | H10N 70/8828 257/E21.003 |
| 2015/0123066 | A1 * | 5/2015 | Gealy | H10N 70/841 257/4 |
| 2017/0117328 | A1 * | 4/2017 | Terai | H10N 70/826 |
| 2018/0047784 | A1 * | 2/2018 | Ohba | H10N 70/245 |
| 2018/0277601 | A1 * | 9/2018 | Ahn | H10B 63/80 |
| 2023/0060906 | A1 * | 3/2023 | Xie | H10N 50/80 |
| 2023/0371279 | A1 * | 11/2023 | Wu | H10N 70/841 |
| 2024/0040802 | A1 * | 2/2024 | Wu | H10B 63/30 |

* cited by examiner

*Primary Examiner* — Mounir S Amer
(74) *Attorney, Agent, or Firm* — JCIPRNET

(57) ABSTRACT

A memory device includes a substrate, a bottom electrode disposed over the substrate, a memory layer disposed over the bottom electrode, a selector layer disposed over the memory layer, and a top electrode disposed over the selector layer. The selector layer is an oxygen-doped chalcogenide based film, and an oxygen content of the selector layer is about 10 at % or less.

20 Claims, 8 Drawing Sheets

MEMORY DEVICE AND METHOD OF FORMING THE SAME

CROSS-REFERENCE TO RELATED APPLICATION

This application claims the priority benefit of U.S. provisional application Ser. No. 63/392,492, filed on Jul. 26, 2022 and Ser. No. 63/419,714, filed on Oct. 27, 2022. The entirety of the above-mentioned patent application is hereby incorporated by reference herein and made a part of this specification.

BACKGROUND

Memory devices are used in integrated circuits for electronic applications, including radios, televisions, cell phones, and personal computing devices, as examples. Consumer electronics requires low power-consumption and high density non-volatile memory. In order to eliminate the sneak path and reduce the power consumption, a selector layer is needed for each memory cell, for example, a resistive random access memory (RRAM) cell or a phase change random access memory (PCRAM). While the existing memory devices have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
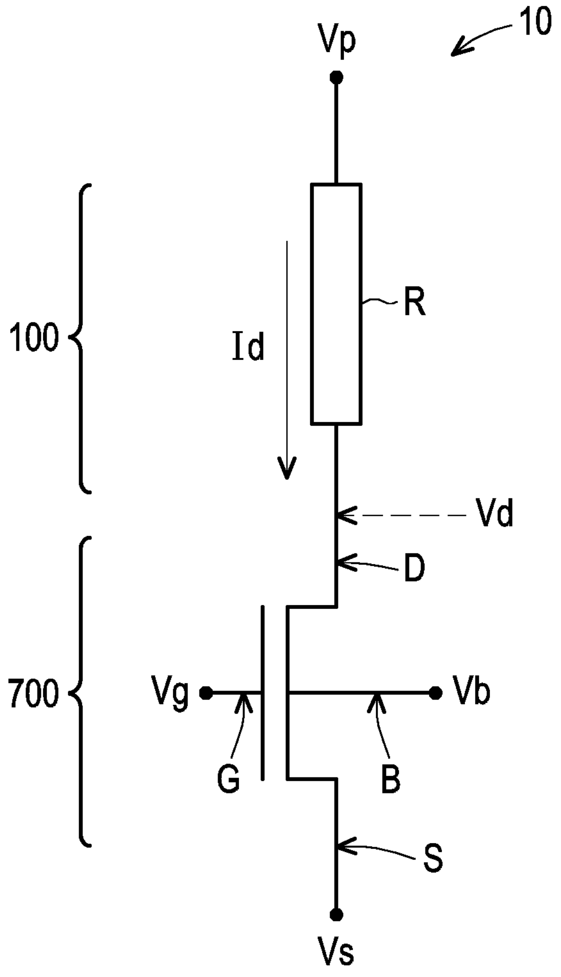
FIG. 1 is a schematic view of a memory structure including a memory cell and a field effect transistor, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ranges can be expressed herein as from "about" one particular value, and/or to "about" another particular value. When such a range is expressed, examples include from the one particular value and/or to the other particular value. Similarly, when values are expressed as approximations, by use of the antecedent "about" or "substantially" it will be understood that the particular value forms another aspect. In some embodiments, a value of "about X" may include values of +/−1% X. It will be further understood that the endpoints of each of the ranges are significant both in relation to the other endpoint, and independently of the other endpoint.

FIG. 1 is a schematic view of a memory structure 10 constructed according to an embodiment. The memory structure 10 may include a memory cell 100 and a current-controlling device 700 electrically connected to each other. The memory cell 100 includes a memory layer interposed between two electrodes. In some embodiments, the resistance of the memory layer is configured to be adjusted into multiple levels that represent different logic states, respectively. The memory layer may be a phase change random access memory (PCRAM) layer or a resistive random access memory (RRAM) layer. The current-controlling device 700 in the memory structure 10 may be a device that is operable to control the current flow through the memory cell 100 during the operations. In the present embodiment, the current-controlling device 700 is a transistor (or selector transistor), such as a field effect transistor (FET). For example, the FET 700 may be a metal-oxide-semiconductor (MOS) FET. The FET 700 includes source S, drain D and gate G. In some embodiments, the source S and drain D may be designed asymmetrically, such that a voltage drop over the FET during a forming operation and an off-state leakage current may be collectively optimized. The source S and drain D may separately formed, so that the source S and drain D may be independently tuned to achieve the asymmetric structure. More particularly, the source S and drain D may be different from each other in term of doping concentration. In some embodiments, the source and drain may be different in at least one of doping concentration, doping profile and doping species. In other embodiments, the source S and drain D may be designed symmetrically and simultaneously formed, and the operation may be properly adjusted by applying different voltages to generate a voltage drop over the FET.

The FET 700 may be electrically coupled with the memory cell 100. In the present example, one electrode of the memory cell 100 is electrically connected to the drain D of the FET 700. The gate G of the FET 700 may be electrically connected to a word line, and another electrode of the memory cell 100 may be electrically connected to a bit line, as discussed in detail with reference to FIG. 3.

As illustrated in FIG. 1, the gate, source, drain and body of the FET 700 are labeled as G, S, D, and B, respectively. The corresponding voltages of the gate, source, drain and substrate during the operations are labeled as Vg, Vs, Vd and Vb, respectively. Furthermore, during operation, the current through the memory cell 100 is labeled as Id, and the voltage applied to one electrode of memory cell 100 from the bit line is labeled as Vp.

In one embodiment, the memory structure 10 may be a two terminal memory structure, with the gate of the FET 700 operating as a first terminal, and one electrode of the memory cell 100 operating as a second terminal. The first terminal is controlled by a first voltage applied to the gate G of FET 700 from the word line, and the second terminal is controlled by a second voltage applied to the one electrode of the memory cell from the bit line. In one example, the source is grounded, and the body of the FET 700 is grounded or floating.

In another embodiment, the memory structure 10 may be a three terminal memory structure, wherein the three terminals include the gate of FET 700 as a first terminal, the electrode of the memory cell 100 (the electrode that is not directly connected with the drain of the transistor) as a second terminal, and the source of the FET 700 as a third terminal. Particularly, during the operations of the memory cell 100, the first terminal (gate) may be controlled by a first voltage from the word line, the second terminal may be controlled by a second voltage from the bit line, and the third terminal may be controlled by a third voltage from a source line. In one example, the source is grounded. In an alternative example, the second terminal is grounded. The substrate (or the body) of the FET 700 may be grounded or floating.

Figure 2:
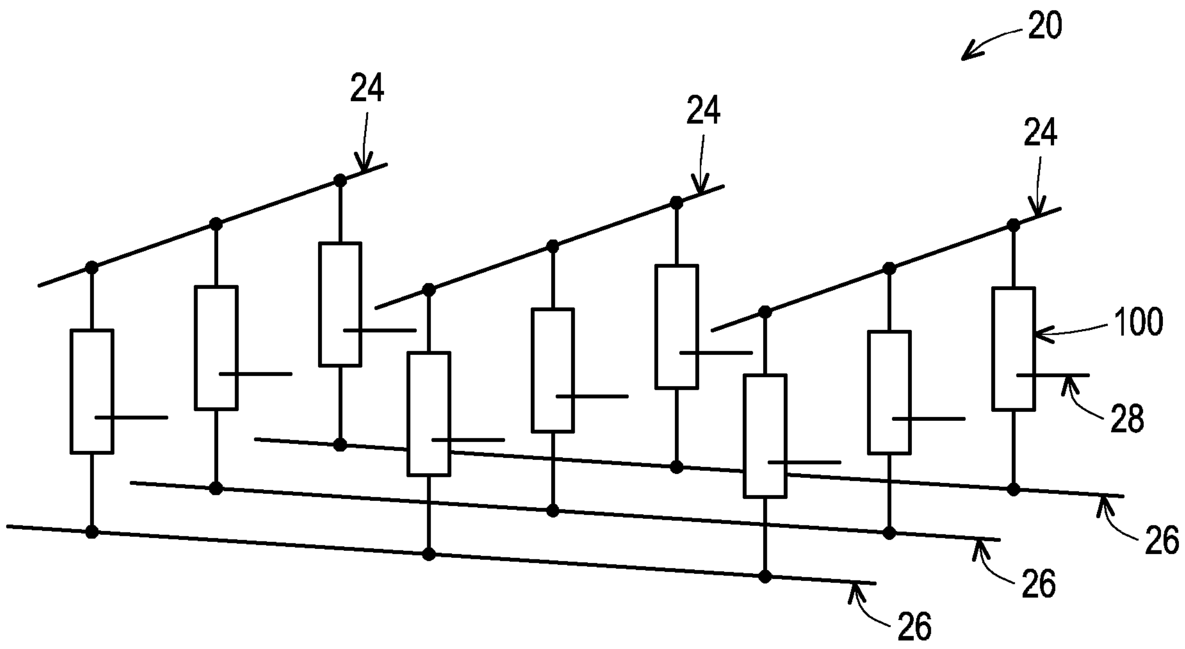
FIG. 2 is a schematic view of a memory structure including multiple memory cells, according to some embodiments of the present disclosure.

FIG. 2 is a schematic view of a memory structure 20 having a plurality of memory cells 100 constructed according some embodiments of the present disclosure. The memory cells 100 may be configured in an array coupled with a plurality of word lines 24 and a plurality of bit lines 26. In some embodiments, the word lines 24 and the bit lines 26 may be cross-configured. Furthermore, each of the memory cells 100 may be operable to achieve multiple resistance levels and accordingly multiple bit storage. In the present embodiment, source lines 28 are configured to connect to the sources of the memory cells 100, respectively. The source lines 28 may be configured such that one source line 28 is coupled with one respective memory cell 100. Alternatively, one source line may be coupled with a subset of the memory cells 100 in the memory structure 20.

Figure 3:
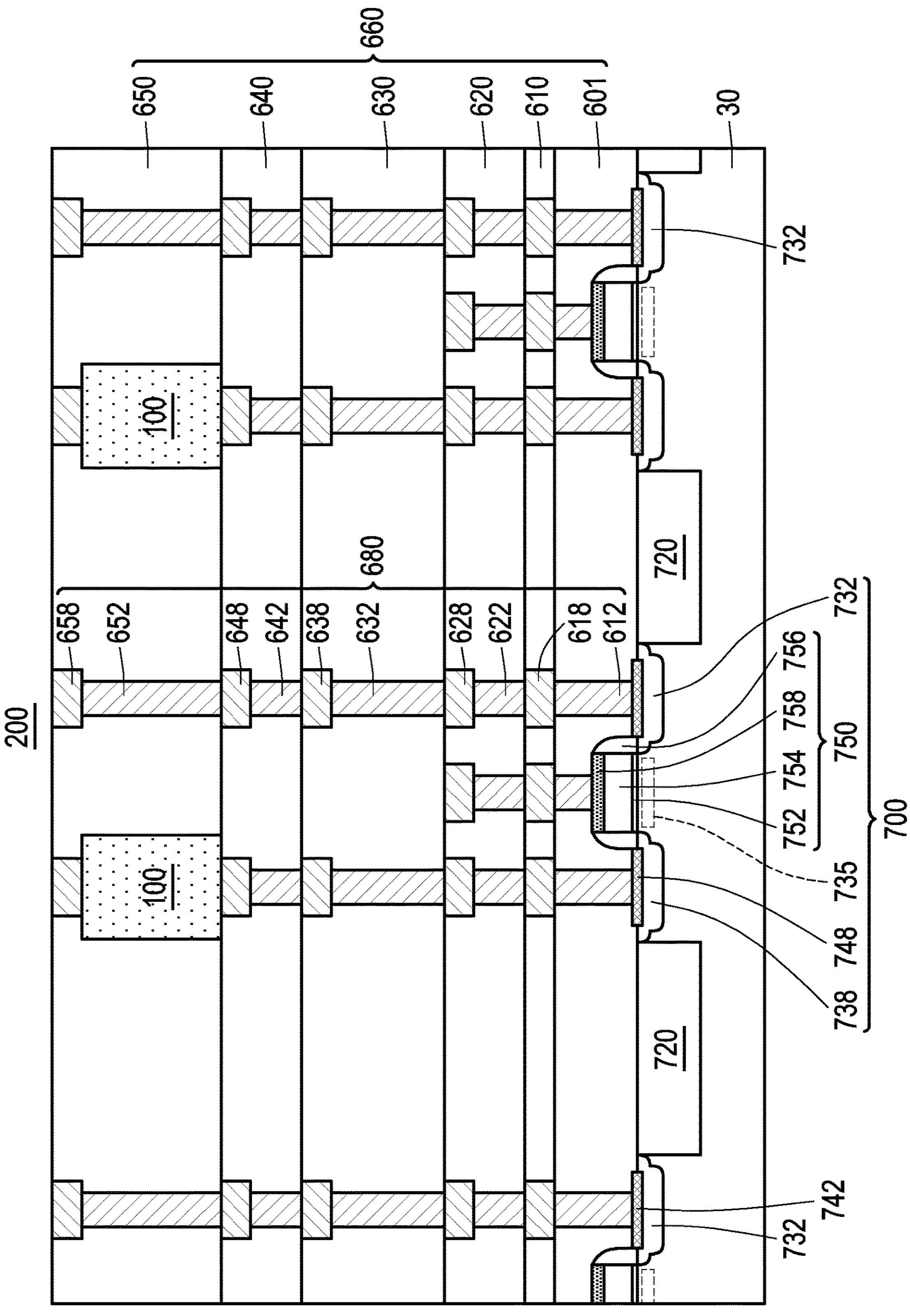
FIG. 3 is a cross-sectional view of a memory device according to some embodiments of the present disclosure.

FIG. 3 is a cross sectional view of a memory device 200, according to some embodiments of the present disclosure. Referring to FIG. 3, the memory device 200 includes one or more memory cells 100 and corresponding field effect transistors (FETs) 700, disposed on a substrate 30. The memory device 200 can include a two-dimensional array of memory cells arranged in a 1T1R configuration, i.e., a configuration in which one access transistor is connected to one resistive memory cell.

The substrate 30 can be a semiconductor substrate such as a silicon substrate. Alternatively, or additionally, the substrate 30 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. Other suitable materials within the contemplated scope of disclosure may also be used.

The FETs 700 may provide functions that are needed to operate the memory cells 100. Specifically, the FETs 700 can be configured to control the programming operation, the erase operation, and the sensing (read) operation of the memory cells 100. In some embodiments, the memory device 200 may include sensing circuitry and/or a top electrode bias circuitry on the substrate 30. The FETs 700 may include complementary metal-oxide-semiconductor (CMOS) transistors. The substrate 30 may optionally include additional semiconductor devices, such as resistors, diodes, capacitors, etc.

Shallow trench isolation structures 720 including a dielectric material such as silicon oxide can be formed in an upper portion of the substrate 30. Suitable doped semiconductor wells, such as p-type wells and n-type wells can be formed within each area that is laterally enclosed by a continuous portion of the shallow trench isolation structures 720. Accordingly, the FETs 700 may be formed on the substrate 30 between the isolation structures 720, such that the FETs 700 may be electrically isolated from one another by the isolation structures 720.

Each FET 700 may include a source region 732, a drain region 738, a semiconductor channel 735 that includes a surface portion of the substrate 30 extending between the source region 732 and the drain region 738, and a gate structure 750. Each gate structure 750 can include a gate dielectric 752, a gate electrode 754, a gate cap dielectric 758, and a dielectric gate spacer 756. A source-side metal silicide region 742 can be formed on each source region 732, and a drain-side metal silicide region 748 can be formed on each drain region 738.

In some embodiments, the channel region 735 may be doped with a first type dopant, and the source region 732 and the drain region 738 may be doped with a second type dopant, opposite to the first type. In the present example, the FET 700 may be an n-type FET (nFET). Accordingly, the channel region 735 may be p-type channel.

In one embodiment, the source region 732 may be formed by a first ion implantation process, and the drain region 738 may be formed by a second ion implantation process. The second ion implantation process may be different from the first ion implantation process in at least one of doping dose, implanting angle and dopant (doping species). In some embodiments, the first ion implantation process and the second ion implantation process may be performed separately. However, the disclosure is not limited thereto. In other embodiments, the source region 732 and the drain region 738 may be performed by the same implantation process simultaneously.

In some embodiments, a device interconnect structure including metal interconnect features 680 embedded by dielectric layers 660 is formed over a device layer, and multiple memory cells such as memory cells 100 are formed between the lower interconnect structure and the upper interconnect structure of the device interconnect structure.

The metal interconnect features 680 formed in dielectric layers 660 may be formed over the substrate 30 and the devices formed thereon (such as the FETs 700). The dielectric layers 660 can include, for example, a contact-level dielectric layer 601, a first metal-line-level dielectric layer 610, a second line-and-via-level dielectric layer 620, a third line-and-via-level dielectric layer 630, a fourth line-and-via-level dielectric layer 640, and a fifth line-and-via-level dielectric layer 650.

In some embodiments, the method of forming metal interconnect features 680 includes performing single-damascene processes, dual-damascene processes, electroplating processes or the like. In some embodiments, the method of forming the dielectric layers 660 includes performing deposition processes followed by photolithography and etching processes.

The metal interconnect features 680 may include metal contacts 612 formed in the contact-level dielectric layer 601 and that contact respective component of the FETs 700, first metal lines 618 formed in the first metal-line-level dielectric layer 610, first metal vias 622 formed in a lower portion of the second line-and-via-level dielectric layer 620, second metal lines 628 formed in an upper portion of the second line-and-via-level dielectric layer 620, second metal vias 632 formed in a lower portion of the third line-and-via-level dielectric layer 630, third metal lines 638 formed in an upper portion of the third line-and-via-level dielectric layer 630, third metal vias 642 formed in a lower portion of the fourth line-and-via-level dielectric layer 640, fourth metal lines 648 formed in an upper portion of the fourth line-and-via-level dielectric layer 640, fourth metal vias 652 formed in a lower portion of the fifth line-and-via-level dielectric layer 650, and fifth metal lines 658 formed in an upper portion of the fifth line-and-via-level dielectric layer 650. In some embodiments, the metal interconnect features 680 can include source line that are connected a source-side power supply for an array of memory elements. The voltage provided by the source lines can be applied to the bottom electrodes through the access transistors provided in the memory array region 100.

Each of the dielectric layers (601, 610, 620, 630, 640, 650) may include a dielectric material such as undoped silicate glass, a doped silicate glass, organosilicate glass, amorphous fluorinated carbon, porous variants thereof, or a combination thereof. Each of the metal interconnect features (612, 618, 622, 628, 632, 638, 642, 648, 658) may include at least one conductive material, which can be a combination of a metal liner layer (such as a metal nitride or a metal carbide) and a metal fill material. Each metal liner layer can include TiN, TaN, WN, TiC, TaC, WC, or a combination thereof, and each metal fill material portion can include W, Cu, Al, Co, Ru, Mo, Ta, Ti, an alloy thereof, or a combination thereof. Other suitable materials within the contemplated scope of disclosure may also be used. In some embodiments, each of the metal contacts 612 and the first metal lines 618 may be formed by a single damascene process, the first metal vias 622 and the second metal lines 628 may be formed as integrated line and via structure by a dual damascene process, the second metal vias 632 and the third metal lines 638 may be formed as integrated line and via structure by a dual damascene process, the third metal vias 642 and the fourth metal lines 648 may be formed as integrated line and via structure by a dual damascene process, and/or the fourth metal vias 652 and the fourth metal lines 648 may be formed as integrated line and via structure by a dual damascene process.

In some embodiments, the memory cells 100 may be disposed within the fifth dielectric layer 650, and each memory cell 100 may be electrically connected to a respective fourth metal line 648 and a fifth metal line 658.

However, the present disclosure is not limited to any particular location for the memory cells 100. For example, the memory cells 100 may be disposed within any of the dielectric layers 660.

The metal interconnect features 680 may be configured to connect each memory cell 100 to a corresponding FET 700, and to connect the FET 700 to corresponding signal lines. For example, the drain region 738 of the FET 700 may be electrically connected to a bottom electrode (see FIGS. 4A-4B) of the memory cell 100 via, for example, a subset of the metal contacts or vias (612, 622, 632, 642) and a subset of the metal lines (618, 628, 638, 648). Each drain region 738 may be connected to a first node (such as a bottom node) of a respective memory cell 100 via a respective subset of the metal interconnect features 680. The gate electrode 754 of each FET 700 may be electrically connected to a word line, which can be embodied as a subset of the metal interconnect features 680. A top electrode (see FIGS. 4A-4B) of each memory cell 100 may be electrically connected to a respective bit line, which is embodied as a respective subset of the metal interconnect features. Each source region 732 may be electrically connected to a respective source line, which is embodied as a respective subset of the metal interconnect features. While only five levels of metal lines are illustrated in FIG. 3, it is understood that more metal line levels can be formed above the illustrated levels of FIG. 3. Further, it is understood that the levels in which the source lines, word lines, and bit lines are formed may be selected based on design parameters.

Figure 4A:
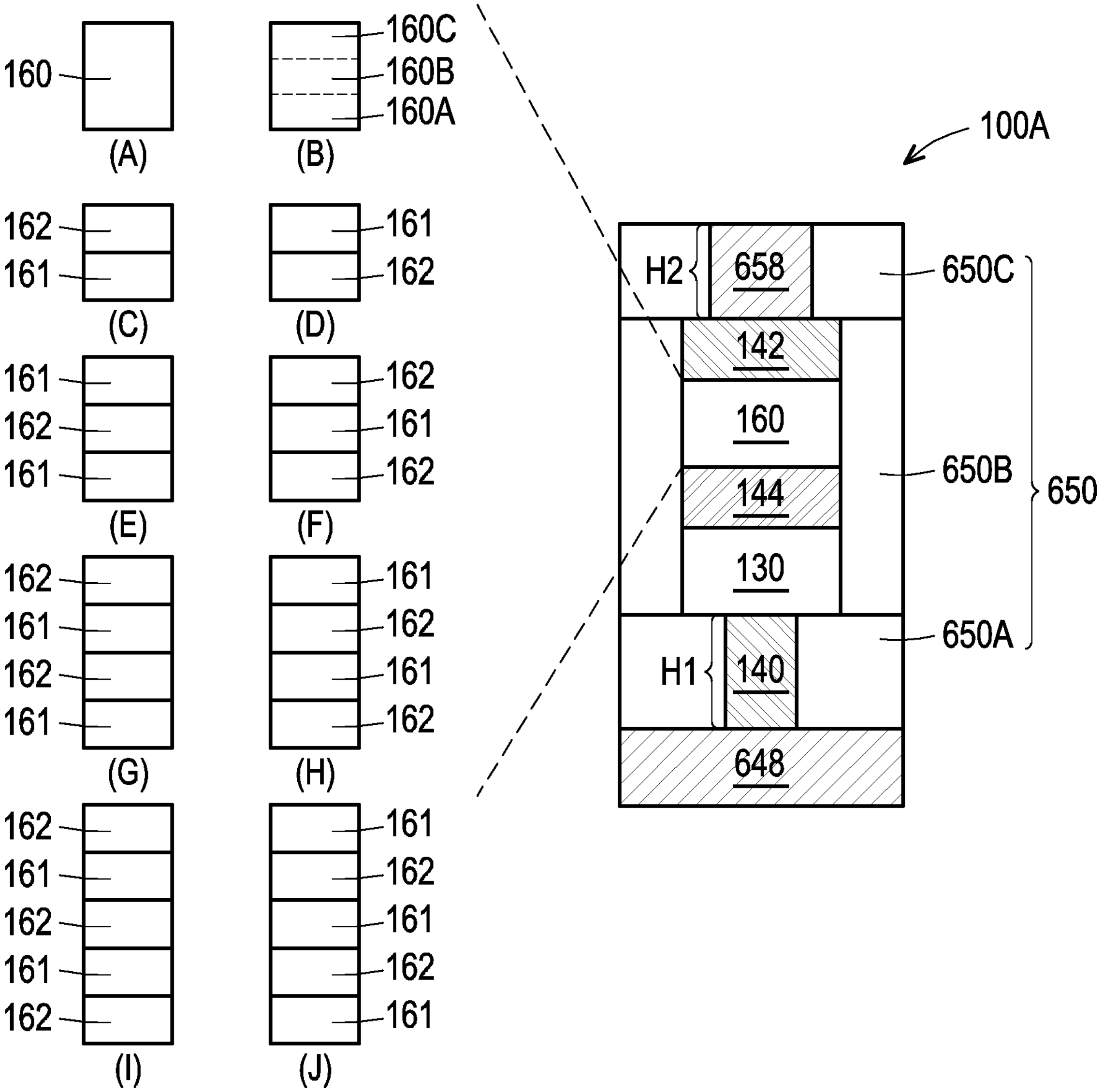
FIG. 4A to FIG. 4B are cross-sectional views of memory cells that may be included in the memory device of FIG. 3, according to some embodiments of the present disclosure.
Figure 4B:
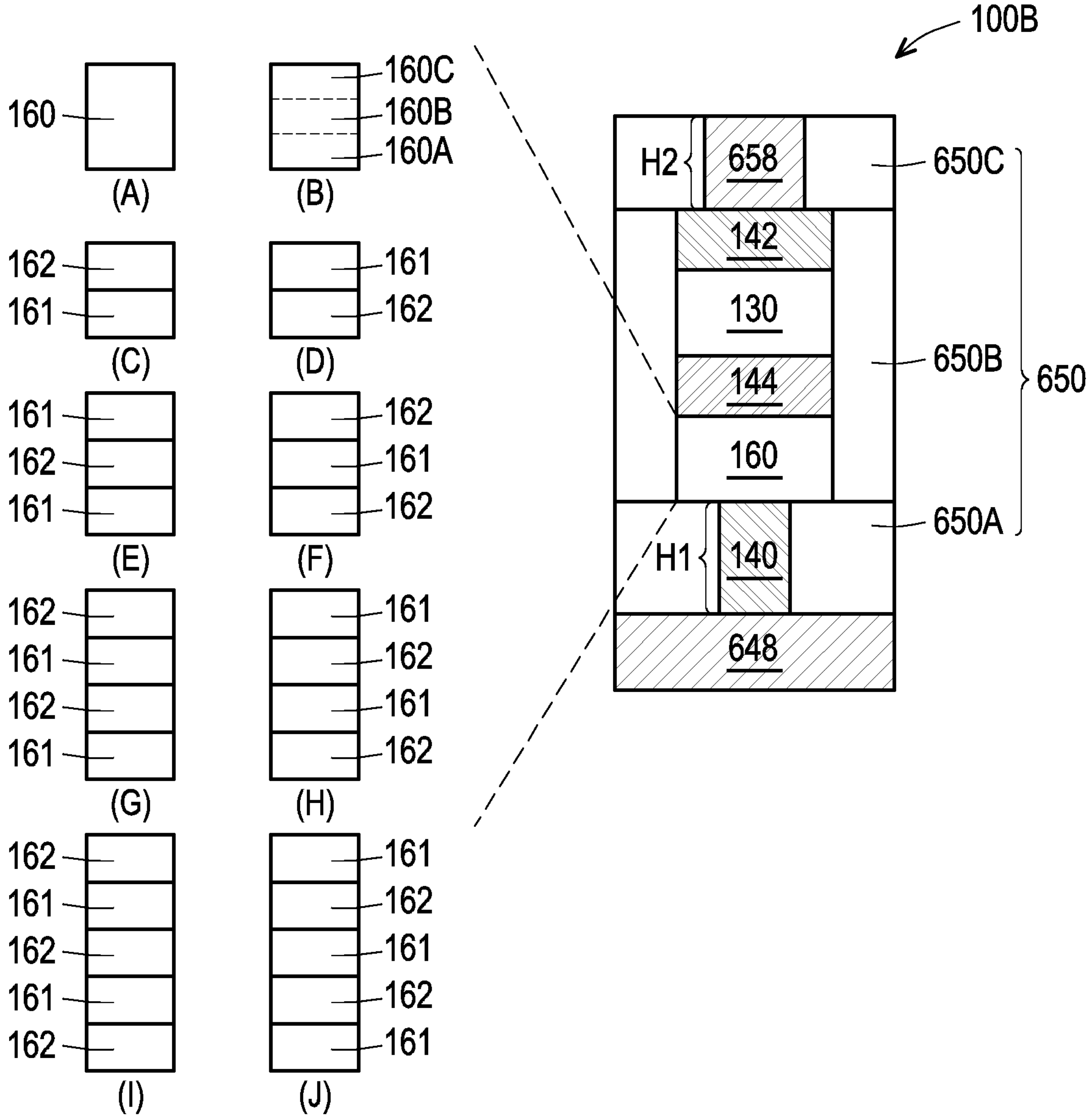

FIG. 4A to FIG. 4B are cross-sectional views of memory cells 100A and 100B that may be included in the memory device of FIG. 3, according to some embodiments of the present disclosure. The memory cell 100A is similar to the memory cell 100B, and the difference between them lies in the locations of a memory layer and a selector layer. Specifically, the locations of the memory layer and the selector layer may be exchanged as needed.

Referring to FIG. 3, FIG. 4A and FIG. 4B, the memory cell 100A/100B may be disposed between two overlapping conductive lines, such as metal lines 648 and 658. With respect to the memory cell 100A/100B, the metal lines 648,658 may be respectively referred to herein as a bottom conductive line 648 and a top conductive line 658.

In some embodiments, the memory cell 100A includes an electrode 140 disposed on the bottom conductive line 648, a memory layer 130 disposed on the bottom electrode 140, an electrode 144 disposed on the memory layer 130, a selector layer 160 disposed on the electrode 144, and an electrode 142 disposed on the selector layer 160. In some embodiments, the memory cell 100B includes an electrode 140 disposed on the bottom conductive line 648, a selector layer 160 disposed on the electrode 140, an electrode 144 disposed on the selector layer 160, a memory layer 130 disposed on the electrode 144, and an electrode 142 disposed on the memory layer 130. The electrode 140 may be electrically connected to the conductive line 648, and the electrode may be electrically connected to the overlapping conductive line 658.

In some embodiments, the dielectric layer 650 may include a bottom dielectric layer 650A, a middle dielectric layer 650B, and a top dielectric layer 650C. The dielectric layers 650A-650C may have a thickness in a range from about 5 to about 350 nm, for example, although greater or lesser thicknesses may be within the contemplated scope of disclosure.

In some embodiments, the bottom dielectric layer 650A contacts side surfaces of the bottom electrode 140 and top surface of the bottom conductive line 648. In particular, the bottom electrode 140 may be disposed in a via opening or through-hole H1 formed in the bottom dielectric layer 650A and may electrically connect the conductive line 648 and the memory layer 130. The memory layer 130, the electrode 144, the selector layer 160, and the top electrode 142 may be disposed within the middle dielectric layer 650B. For example, the middle dielectric layer 650B may be deposited after forming the top electrode 142. In some embodiments, the memory cell 100A/100B is in contact with the dielectric layer 650B. In other embodiments, the memory cell 100A/100B is separated from the dielectric layer 650B, with a blocking spacer (e.g., silicon nitride or silicon carbide) between the memory cell 100A/100B and the dielectric layer 650B. The top dielectric layer 650C may include a through-hole H2 in which the top conductive line 658 is disposed. While the dielectric layers 650A, 650B and 650C are shown in FIG. 4A and FIG. 4B as being distinct layers, the dielectric layers 650A, 650B and 650C may be substantially indistinguishable from one another.

The electrodes 140, 142, 144 may be formed of a conductive material such as TiN, TaN, Cu, W, Ru, Co, C, silicon doped carbon (silicon <5 at %), the like or a combination thereof. Other suitable materials are within the contemplated scope of disclosure. The electrodes 140, 142, 144 may be configured to provide electrical connection and/or prevent the diffusion metal species from the bottom and/or top metal lines 648, 658 into the memory layer 130 and/or the selector layer 160. The electrodes 140, 142, 144 may have a thickness in a range from about 5 to about 50 nm. Although greater or lesser thicknesses may be within the contemplated scope of disclosure. In some embodiments, the electrode 140 is referred to as a "bottom electrode" or "lower electrode", the electrode 144 is referred to as a "top electrode" or "upper electrode", and the electrode 142 is referred to as a "middle electrode", "barrier electrode" or "barrier layer". The dielectric layer 650 may also be configured to prevent and/or reduce heat transfer between adjacent memory cells 100, so as to avoid thermal disturbance which may disable state retention or interrupt the read/write process.

The memory layer 130 is disposed between the bottom electrode 140 and the top electrode 142. In some embodiments, the memory layer 130 is disposed between the bottom electrode 140 and the barrier electrode 144, as shown in FIG. 4A. In some embodiments, the memory layer 130 is disposed between the top electrode 142 and the barrier electrode 144, as shown in FIG. 4B. The memory layer 130 may have a single-layer or multi-layered structure. The memory layer 130 may have a thickness ranging from about 10 nm to about 30 nm. Although greater or lesser thicknesses may be within the contemplated scope of disclosure. The memory layer 130 may be formed using chemical vapor deposition (CVD), physical deposition (PVD) such as sputtering, the like, or a combination thereof.

In some embodiments, the memory layer 130 is a PCRAM layer including a phase change material. In these embodiments, a crystallinity of the phase change material may be increased when the phase change material is turned to the low resistance state. On the other hand, when the phase change material is in the high resistance state, the phase change material may be amorphous or may have a rather low crystallinity. In some embodiments, the phase change material may include a chalcogenide material containing one or more of Ge, Te and Sb. In some embodiments, the phase change material includes GeSbTe, such as $Ge_2Sb_2Te_5$ (GST225), $Ge_4Sb_2Te_4$ (GST424), $Ge_4Sb_6Te_7$ (GST467) or the like. In other embodiments, the phase change material includes ScSbTe, GeTe, InSb, $Sb_2Te_3$, $Sb_{70}Te_{30}$, GaSb, InSbTe, GaSeTe, $SnSbTe_4$, InSbGe, AgInSbTe, $Te_{81}Ge_{15}Sb_2S_2$, (Ge,Sn)SbTe, GeSb(SeTe) or the like. According to various embodiments, the phase change material of the disclosure may be doped with less than about 10 at % of Si, Sc, Ga, C, O, N or a combination thereof. For example, the phase change material of the disclosure may be doped with Si, C, O and N to improve its performance. Other suitable materials are within the contemplated scope of disclosure.

In other embodiments, the memory layer 130 is a RRAM layer including a resistive-switching material. The resistive-switching material may be a dielectric layer, such as a high-k dielectric layer. In these embodiments, a conductive filament may be formed through the resistive-switching material when the resistive-switching material is at the low resistance, while such conductive filament may be cut off when the resistive-switching material is switched to the high resistance state. In some embodiments, the resistive-switching material includes a metal oxide, such as a transition metal oxide. The transition metal oxide may include $ZrO_2$, NiO, $TiO_2$, $HfO_2$, ZrO, ZnO, $WO_3$, CoO, $Nb_2O_5$, $Fe_2O_3$, CuO, $CrO_2$, $Ta_2O_5$, the like, or a combination thereof. Other suitable materials are within the contemplated scope of disclosure.

The selector layer 160 is disposed between the bottom electrode 140 and the top electrode 142. In some embodiments, the selector layer 160 is disposed between the top electrode 142 and the barrier electrode 144, as shown in FIG. 4A. In some embodiments, the selector layer 160 is disposed between the bottom electrode 140 and the barrier electrode 144, as shown in FIG. 4B. In some embodiments, the selector layer 160 provides a current-voltage non-linearity to the memory structure, and this reduces leakage current. The selector layer 160 may have a single-layer or multi-layered structure. The selector layer 160 may have a thickness ranging from about 1 nm to about 15 nm. Although greater or lesser thicknesses may be within the contemplated scope of disclosure. In some embodiments, the selector layer 160 is formed by chemical vapor deposition (CVD), physical vapor deposition (PVD) such as sputtering, the like, or a combination thereof.

In some embodiments, the selector layer 160 includes an oxygen-doped GeCTe. In some embodiments, the oxygen-doped GeCTe composition as a selector material contains a Ge content of about 10 at % to 40 at % (e.g., 15 at % to 35 at %), a C content of about 10 at % to 30 at % (e.g., 15 at % to 25 at %), and a Te content of about 40 at % to 70 at % (e.g., 45 at % to 65 at %), and an O content of about 0.05 at % to 10 at % (e.g., 0.2-0.5 at %, 0.1-5 at %, 0.5-8 at % or 5-10 at %). Doping few oxygen atoms to the GeCTe (hereinafter GCT) composition improves the performance (e.g., leakage current at half threshold voltage) of the memory device. However, the performance (e.g., endurance) of the memory device is degraded when the oxygen level is too high (e.g., more than 10 at %). The range of the oxygen content within the selector layer is quite critical.

In some embodiments, such oxygen-doped GeCTe composition is applied to the memory layer 130 and functions as a phase change material. In some embodiments, the oxygen-doped GeCTe composition as a phase change material contains a Ge content of about 40 at % to 60 at % (e.g., 45 at % to 55 at %), a C content of about 0 at % to 10 at % (e.g., 0.1 at % to 5 at %), and a Te content of about 40 at % to 60 at % (e.g., 45 at % to 55 at %), and an O content of about 0.05 at % to 10 at % (e.g., 0.2-0.5 at %, 0.1-5 at %, 0.5-8 at % or 5-10 at %).

Figure 5:
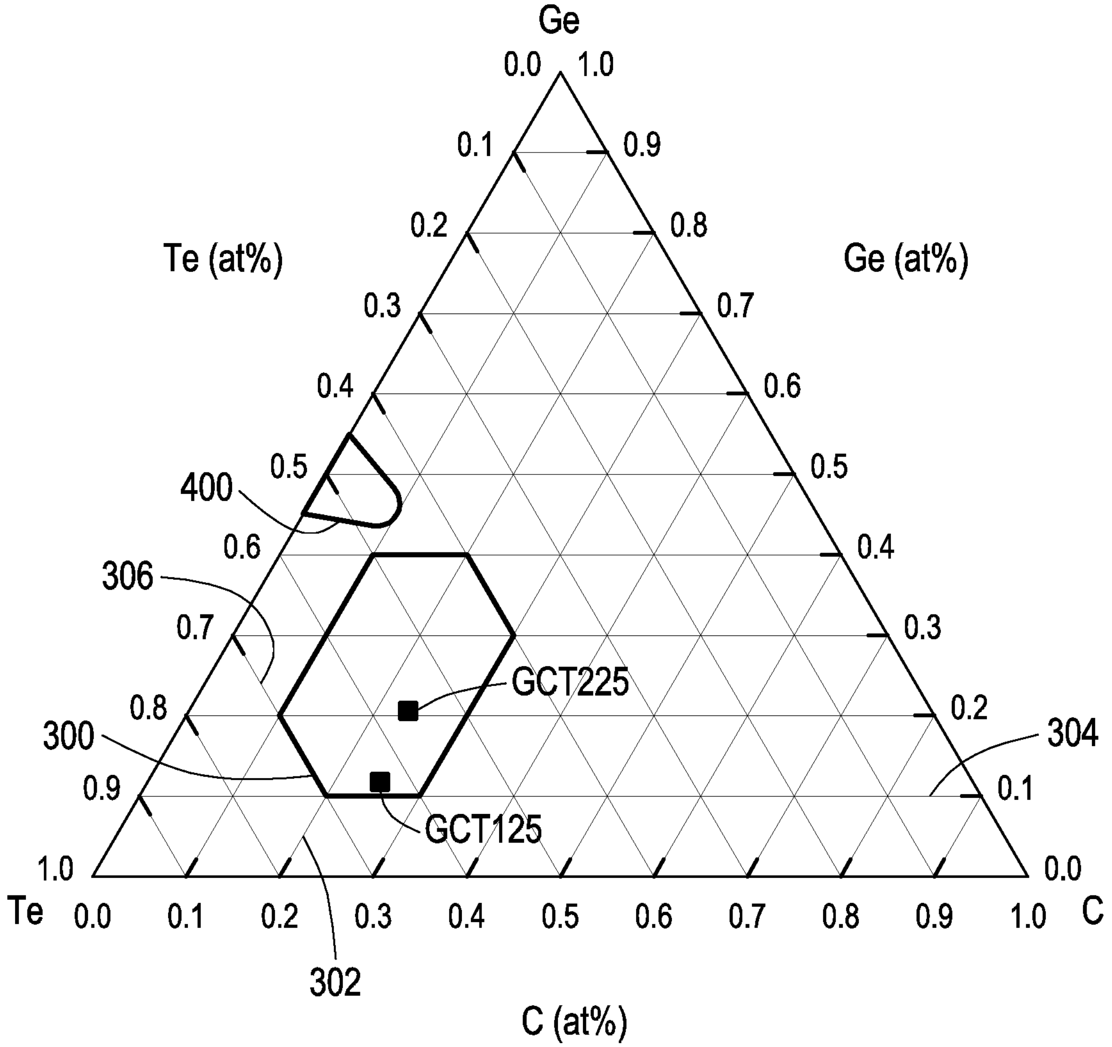
FIG. 5 is a ternary composition diagram of chalcogenide materials according to some embodiments of the disclosure.

FIG. 5 is a ternary composition diagram of chalcogenide materials according to some embodiments of the disclosure. The compositions of the materials of the disclosure may be read by following the oblique lines 302 to determine the amount (atomic percent) of Ge, following the horizontal lines 304 to determine the amount (atomic percent) of C, and following the oblique lines 306 to determine the amount (atomic percent) of Te.

In some embodiments, the selector materials of the disclosure encompassed by the shape 300 include the group of $Ge_xC_yTe_z$ materials, wherein x, y and z are greater than zero. For example, $GeC_2Te_5$ (hereinafter GCT125) and $Ge_2C_2Te_5$ (hereinafter GCT225) are within the group of selector materials. Specifically, in the selector materials of the disclosure encompassed by the shape 300, the Ge atomic percentage concentration is within a range from about 10 at % to 40 at %, the C atomic percent concentration is within a range from about 10 at % to 30 at %, and the Te atomic percent concentration is within a range from about 40% to 70%. The oxygen doping of the selector materials of the disclosure is not shown in FIG. 5. In some embodiments, oxygen atoms are doped in the selector materials encompassed by the shape 300 in FIG. 5 by introducing an oxygen-containing gas during the sputtering process, which will be described in details below.

In some embodiments, the phase change materials of the disclosure encompassed by the shape 400 include the group of $Ge_xC_yTe_z$ materials, wherein x and z are greater than zero, and y is equal to zero or greater than zero. Specifically, in the phase change materials of the disclosure encompassed by the shape 400, the Ge atomic percentage concentration is within a range from about 45 at % to 55 at %, the C atomic percent concentration is within a range from about 0 at % to 10 at %, and the Te atomic percent concentration is within a range from about 45% to 55%. The oxygen doping of the phase change materials of the disclosure is not shown in FIG. 5. In some embodiments, oxygen atoms are doped in the phase change materials encompassed by the shape 400 in FIG. 5 by introducing an oxygen-containing gas during the sputtering process, which will be described in details below.

Figure 6:
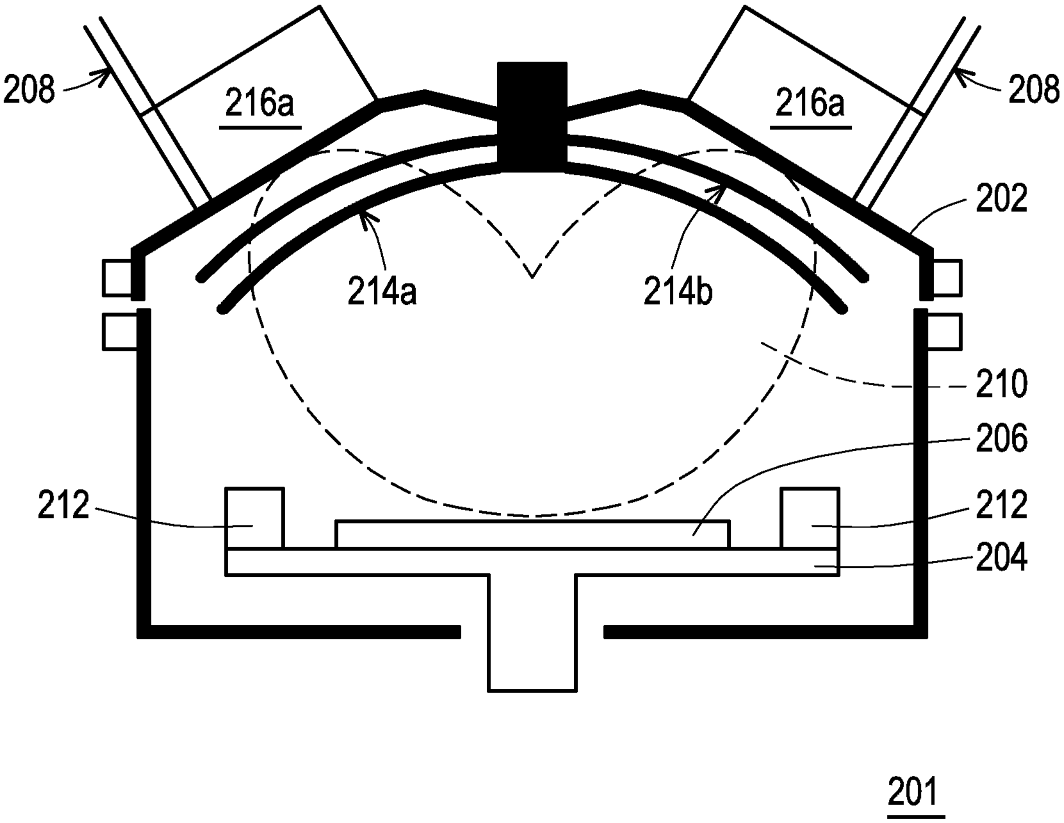
FIG. 6 illustrates a co-sputtering apparatus for forming a selector layer according to some embodiments of the present disclosure.

FIG. 6 illustrates a co-sputtering apparatus 201 for forming a selector layer according to some embodiments of the present disclosure. In some embodiments, the sputtering apparatus 201 includes a vacuum chamber 202 that surrounds a workpiece chuck 204 on which a semiconductor wafer or other semiconductor workpiece 206 is arranged. In some embodiments, the workpiece 206 is the intermediate stage of the memory device 200 at the stage for forming a selector layer such as a selector layer 160. A gas delivery system including one or more pipes with valves, can deliver a sputtering gas and a dopant gas into the vacuum chamber 202 after a vacuum pump has pumped the vacuum chamber 202 down toward vacuum. After the vacuum chamber 202 has been pumped down towards vacuum and the sputtering gas and the dopant gas have been flowed with a semiconductor workpiece 206 in place, a plasma 210 is ignited within the vacuum chamber 202. This plasma 210 is shaped or contained by one or more magnets 212 disposed around an edge of the workpiece chuck 204. One or more shutters 214*a*, 214*b* are opened to expose one or more sputtering targets 216*a*, 216*b* to the plasma 210, which concurrently ejects materials from the one or more sputtering targets 216*a*, 216*b*, so the ejected materials are deposited on the surface of the workpiece 206. The amount of ejection from the one or more sputtering targets 216*a*, 216*b* can be set by tuning a bias applied to each target, which controls the amount and/or velocity of electrons striking each target.

In some embodiments, when the selector layer includes oxygen-doped GeCTe, the sputtering targets 216*a* and 216*b* include a Ge target and a CTe target, the sputtering power ranges from about 5 W to 20 W (DC) and/or from about 100 W to 900 W (AC), and the substrate temperature ranges from a room temperature (e.g., 25° C.) to 200° C. One of the gas pipes 208 is configured to introduce an oxygen-containing gas into the vacuum chamber 202 for doping oxygen atoms into the GCT material deposited on the semiconductor workpiece 206. The oxygen-containing gas includes $O_2$, $O_3$, $N_2O$, the like, or a combination thereof. The oxygen flow rate ranges from about 0.1 sccm to 10 sccm, for example. By tuning biases applied to the sputtering targets 216*a*, 216*b* and adjusting the oxygen flow rate, the atom percentage concentrations of Ge, C, Te and O can be tuned to the desired levels with the desired thickness for the selector layer. In some embodiments, the co-sputtering apparatus 201 can be applied to form a phase change layer such as a phase change layer 130 by adjusting the corresponding process parameters, so the atom percentage concentrations of Ge, C, Te and O can be tuned to the desired levels with the desired thickness for the phase change layer.

The above embodiments in which a co-sputtering apparatus having two sputtering targets are provided for illustration purposes, and are not construed as limited the present disclosure. In other words, the number of the sputtering targets is not limited by the present disclosure. In some embodiments, a co-sputtering apparatus is provided with three sputtering targets including a Ge target, a C target and a Te target, and parameters such as biases applied to the sputtering targets are adjusted accordingly. In some embodiments, a sputtering apparatus is provided with a single GeCTe target, and the parameters such as a bias applied to the single sputtering target are adjusted accordingly.

In addition to the described oxygen-doped GeCTe, other oxygen-doped chalcogenide based materials may be applicable to the selector layer and/or the memory layer of the present disclosure. In some embodiments, at least one of the selector layer and the memory layer includes oxygen-doped GeCTe, oxygen-doped NGeCTe, oxygen-doped SiGeCTe, oxygen-doped NSiGeCTe, the like, or a combination thereof. In some embodiments, at least one of the selector layer and the memory layer includes an oxygen content of about 10 at % or less. Doping few oxygen atoms to the GeCTe based films improves the performance (e.g., leakage current at half threshold voltage) of the memory device. However, the performance (e.g., endurance) of the memory device is degraded when the oxygen level is too high (e.g., more than 10 at %). The range of the oxygen content within the selector layer is quite critical.

In some embodiments, when the selector layer includes oxygen-doped NGeCTe, the sputtering targets include three targets of Ge, C and Te (or two targets of Ge and CTe, or a single GeCTe target), the sputtering power ranges from about 5 W to 20 W (DC) and/or from about 100 W to 900 W (AC), and the temperature ranges from a room temperature (e.g., 25° C.) to 200° C. One of the gas pipes 208 is configured to introduce an oxygen-containing gas into the vacuum chamber 202 for doping oxygen atoms into the GCT material deposited on the semiconductor workpiece 206. The oxygen-containing gas includes $O_2$, $O_3$, $N_2O$, the like, or a combination thereof. The oxygen flow rate ranges from about 0.1 sccm to 10 sccm, for example. In some embodiments, one of the gas pipes 208 is configured to introduce a nitrogen-containing gas into the vacuum chamber 202 for doping nitrogen atoms into the GCT material deposited on the semiconductor workpiece 206. The nitrogen-containing gas includes $N_2$, $NH_3$, $NH_4$, the like, or a combination thereof. The nitrogen flow rate ranges from about 1 sccm to 20 sccm, for example. By tuning biases applied to the sputtering targets and adjusting the oxygen flow rate and the nitrogen flow rate, the atom percentage concentrations of Ge, C, Te, N and can be tuned to the desired levels with the desired thickness for the formed selector layer. Instead of nitrogen doping, the nitrogen content within the selector layer can be achieved by providing and sputtering a $Si_3N_4$ target with a power of 5 W to 20 W (AC) and/or 100 W to 900 W (AC).

In some embodiments, the oxygen-doped NGeCTe composition as a selector material contains a N content of about 1 at % to 15 at % (e.g., 5 at % to 10 at %), a Ge content of about 10 at % to 40 at % (e.g., 15 at % to 35 at %), a C content of about 10 at % to 30 at % (e.g., 15 at % to 25 at %), and a Te content of about 40 at % to 70 at % (e.g., 45 at % to 65 at %), and an O content of about 0.05 at % to 10 at % (e.g., 0.2-0.5 at %, 0.1-5 at %, 0.5-8 at % or 5-10 at %).

In some embodiments, when the selector layer includes oxygen-doped SiGeCTe, the sputtering targets include four targets of Si, Ge, C and Te (or three targets of Si, Ge and CTe, two targets of Si and GCTe, or a single SiGeCTe target), the sputtering power ranges from about 5 W to 20 W (DC) and/or from about 100 W to 900 W (AC), and the temperature ranges from a room temperature (e.g., 25° C.) to 200° C. One of the gas pipes 208 is configured to introduce an oxygen-containing gas into the vacuum chamber 202 for doping oxygen atoms into the SiGeCTe material deposited on the semiconductor workpiece 206. The oxygen-containing gas includes $O_2$, $O_3$, $N_2O$, the like, or a combination thereof. The oxygen flow rate ranges from about 0.1 sccm to 10 sccm, for example. By tuning biases applied to the sputtering targets and adjusting the oxygen flow rate, the atom percentage concentrations of Si, Ge, C, Te and O can be tuned to the desired levels with the desired thickness for the formed selector layer.

In some embodiments, the oxygen-doped SiGeCTe composition as a selector material contains a Si content of about 10 at % to 40 at % (e.g., 15 at % to 35 at %), a Ge content of about 10 at % to 40 at % (e.g., 15 at % to 35 at %), a C content of about 10 at % to 30 at % (e.g., 15 at % to 25 at %), and a Te content of about 40 at % to 70 at % (e.g., 45 at % to 65 at %), and an O content of about 0.05 at % to 10 at % (e.g., 0.2-0.5 at %, 0.1-5 at %, 0.5-8 at % or 5-10 at %).

In some embodiments, when the selector layer includes oxygen-doped NSiGeCTe, the sputtering targets include four targets of Si, Ge, C and Te (or three targets of Si, Ge and CTe, two targets of Si and GCTe, or a single SiGeCTe target), the sputtering power ranges from about 5 W to 20 W (DC) and/or from about 100 W to 900 W (AC), and the temperature ranges from a room temperature (e.g., 25° C.) to 200° C. One of the gas pipes 208 is configured to introduce an oxygen-containing gas into the vacuum chamber 202 for doping oxygen atoms into the GCT material deposited on the semiconductor workpiece 206. The oxygen-containing gas includes $O_2$, $O_3$, $N_2O$, the like, or a combination thereof. The oxygen flow rate ranges from about 0.1 sccm to 10 sccm, for example. In some embodiments, one of the gas pipes 208 is configured to introduce a nitrogen-containing gas into the vacuum chamber 202 for doping nitrogen atoms into the SiGeCTe material deposited on the semiconductor workpiece 206. The nitrogen-containing gas includes $N_2$, $NH_3$, $NH_4$, the like, or a combination thereof. The oxygen flow rate ranges from about 1 sccm to 20 sccm, for example. By tuning biases applied to the sputtering targets and adjusting the oxygen flow rate and the nitrogen flow rate, the atom percentage concentrations of Si, Ge, C, Te, N and O can be tuned to the desired levels with the desired thickness for the formed selector layer. Instead of nitrogen doping, the nitrogen content within the selector layer can be achieved by providing and sputtering a $Si_3N_4$ target with a power of 5 W to 20 W (AC) and/or 100 W to 900 W (AC).

In some embodiments, the oxygen-doped NSiGeCTe composition as a selector material contains a N content of about 1 at % to 15 at % (e.g., 5 at % to 10 at %), a Si content of about 10 at % to 40 at % (e.g., 15 at % to 35 at %), a Ge content of about 10 at % to 40 at % (e.g., 15 at % to 35 at %), a C content of about 10 at % to 30 at % (e.g., 15 at % to 25 at %), and a Te content of about 40 at % to 70 at % (e.g., 45 at % to 65 at %), and an content of about 0.05 at % to 10 at % (e.g., 0.2-0.5 at %, 0.1-5 at %, 0.5-8 at % or 5-10 at %).

In addition, because co-sputtering or sputtering can be carried out at relatively low temperatures compared to some other deposition techniques, the present disclosure can offer advantages from a thermal budget viewpoint, which is particularly desirable in BEOL processing.

In some embodiment, the oxygen content of the selector layer 160 is substantially constant, as shown in the enlarged region (A) of FIG. 4A and FIG. 4B. The selector layer 160 may include an oxygen content of about 10 at % or less. However, the disclosure is not limited thereto.

In other embodiments, the oxygen content of the selector layer 160 is varied (e.g., gradually increased or gradually decreased) in a thickness direction from the bottom electrode 140 to the top electrode 142, as shown in the enlarged view (B) of FIG. 4A and FIG. 4B. For example, the selector layer 160 has multiple sublayers 160A, 160B and 160C, and the oxygen content of the sublayers 160A, 160B and 160C is gradually increased from the bottom electrode 140 to the top electrode 142. In some embodiments, the lower sublayer 160A may include 0-4 at % of oxygen, the middle sublayer 160B may include 4-7 at % of oxygen, and the upper sublayer 160C may include 7-10 at % of oxygen. For example, the selector layer 160 has multiple sublayers 160A, 160B and 160C, and the oxygen content of the sublayers 160A, 160B and 160C is gradually decreased in a thickness direction from the bottom electrode 140 to the top electrode 142. In some embodiments, the lower sublayer 160A may include 7-10 at % of oxygen, the middle sublayer 160B may include 4-7 at % of oxygen, and the upper sublayer 160C may include at % of oxygen. The interface between two adjacent sublayers of the sublayers 160A, 160B and 160C is substantially invisible. The number of the gradient sublayers is not limited to the present disclosure. In some embodiments, the gradient oxygen contents of sublayers of the selector layer can be achieved by adjusting the flow rate of the oxygen-containing gas.

In some embodiments, the selector layer 160 includes at least one first layer 161 and at least one second layer 162 with a visible interface therebetween, as shown in the enlarged views (C) and (J) of FIG. 4A and FIG. 4B. In some embodiments, the first and second layers 161 and 162 are made by different compositions. In other embodiments, the first and second layers 161 and 162 are made by the same composition, but at least one atom concentration (e.g., oxygen concentration) of the composition is different in the first and second layers 161 and 162.

In some embodiments, an oxygen content of the first layer 161 is less than an oxygen content of the second layer 162. In some embodiments, the first layers 161 are oxygen-free or oxygen-poor (<0.1 at %) chalcogenide based films, and the second layers 161 are oxygen-containing or oxygen-rich (0.1-10 at %) chalcogenide based films. In some embodiments, the first layers 161 include GeCTe, NGeCTe, SiGeCTe, NSiGeCTe, or a combination thereof, and the second layers include oxygen-doped GeCTe, oxygen-doped NGeCTe, oxygen-doped SiGeCTe, oxygen-doped NSiGeCTe, or a combination thereof. In some embodiments, the oxygen-containing gas is turned on when the second layers 162 are formed, while the oxygen-containing gas is turned off when the first layers 161 are formed. In some embodiments, the oxygen-containing gas is continuously turned on, but the oxygen flow rates are different when the first and second layers 161 and 162 are formed. In some embodiments, the nitrogen-containing gas is turned on when the second layers 162 are formed, while the nitrogen-containing gas is turned off when the first layers 161 are formed. In some embodiments, the nitrogen-containing gas is turned on when the first layers 161 are formed, while the nitrogen-containing gas is turned off when the second layers 162 are formed. In some embodiments, the nitrogen-containing gas is continuously turned on when the first and second layers 161 and 162 are formed.

In some embodiments, the selector layer 160 includes a first layer 161 and a second layer 162 in contact with each other, as shown in the enlarged views (C) and (D) of FIG. 4A and FIG. 4B. In some embodiments, the selector layer 160 has a sandwich structure including two first layers 161 and one second layers 162 between the two first layers 161, or including two second layers 162 and one first layer 161 between the two second layers 162, as shown in the enlarged views (E) and (F) of FIG. 4A and FIG. 4B. In some embodiments, the selector layer 160 has a laminated structure including first layers 161 and second layers 162 stacked alternately, as shown in the enlarged views (G) and (J) of FIG. 4A and FIG. 4B. The oxygen concentrations of the second layers 162 in the laminated structure may be constant or varied (e.g., gradually increased or gradually decreased) in a thickness direction from the bottom electrode 140 to the top electrode 142, as needed. In some embodiments, the oxygen-free first layer 161 is the uppermost layer and/or the lowermost layer of the selector layer 160, so as to provide a buffer layer between the oxygen-doped selector layer and the adjacent electrode and therefore improve the performance (e.g., leakage current at half threshold voltage) of the memory device, without degrading the endurance of the memory device.

In some embodiments, the element concentrations of the selector layer 160 other than oxygen atoms maintain substantially constant. However, the disclosure is not limited thereto. In other embodiments, the element concentrations of the selector layer 160 other than oxygen atoms may be varied in a thickness direction from the bottom electrode 140 to the top electrode 142. For examples, the nitrogen concentration of the selector layer 160 may be varied (e.g., gradually increased or gradually decreased) in a thickness direction from the bottom electrode 140 to the top electrode 142.

Figure 7:
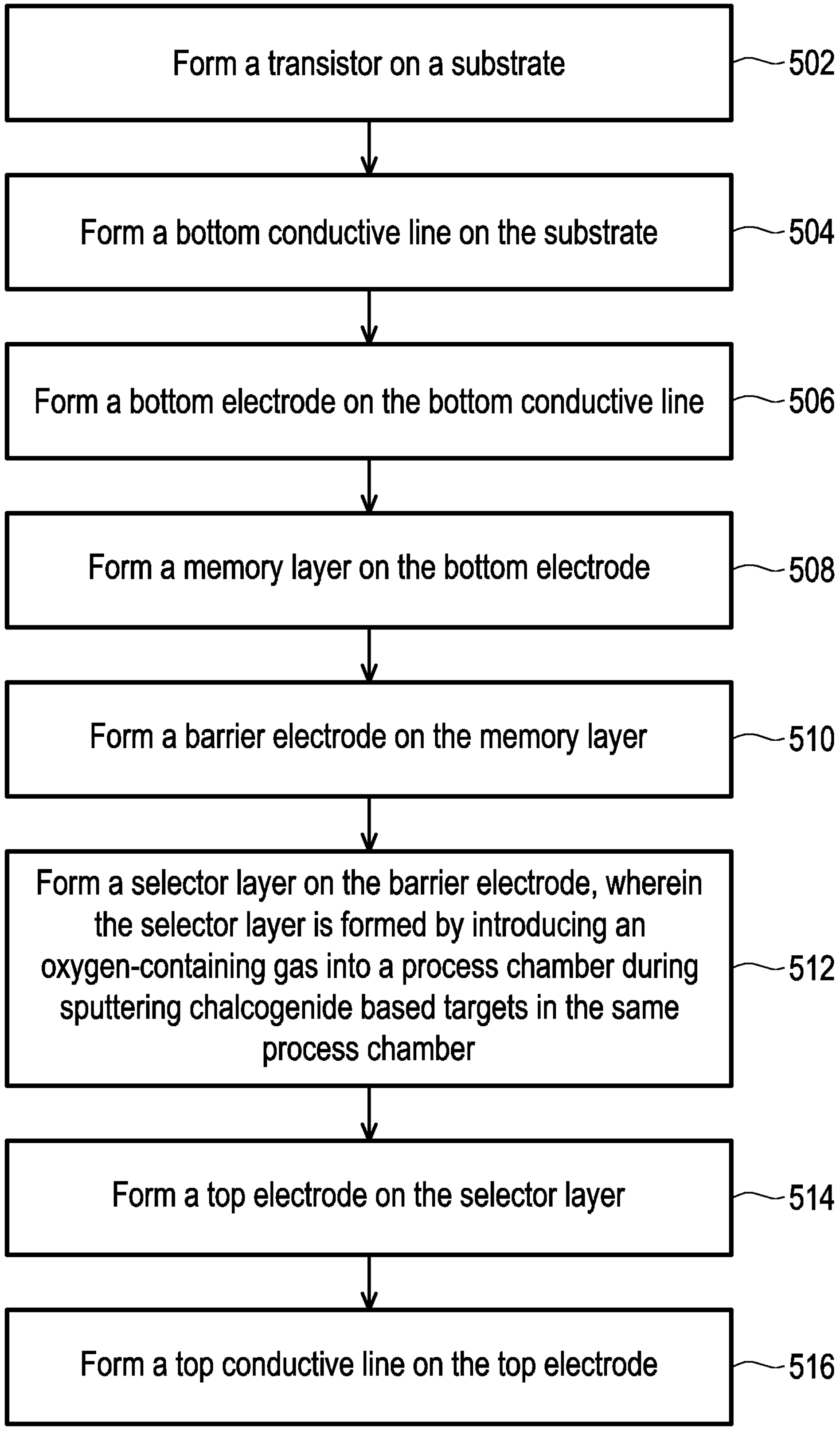
FIG. 7 is a flow chart showing a method of forming a memory device according to some embodiments of the present disclosure.

FIG. 7 is a flow chart showing a method of forming a memory device including a memory cell, according to some embodiments of the present disclosure. While the method is described with respect to forming a single memory cell, the method may include forming multiple memory cells, in some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Referring to FIG. 7, in act 502, the method may include forming at least one transistor on a substrate. For example, a FET 700 may be formed on the substrate 30. Additional FET's 700 may also be formed on the substrate 30 for each memory cell 100 to be included in the memory device 200.

In act 504, metal interconnect features (612, 618, 622, 628, 632, 638, 642, 648, 658) may be formed on the substrate 30. Each of the metal interconnect features (612, 618, 622, 628, 632, 638, 642, 648) is separated by a dielectric layer (e.g., 601, 610, 620, 630, 640), with the conductive lines (e.g., 618, 628, 638, 648) of adjacent layers crossing one another in a mesh or grid pattern. The conductive lines (e.g., 618, 628, 638, 648) may include a bottom conductive line 648 of the memory cell.

In act 506, a bottom electrode 140 is formed on the bottom conductive line 648. In some embodiments, a bottom dielectric layer 650A may be formed on the bottom metal line 648. In act 406, a through-hole H1 may be formed in the bottom dielectric layer 650A using a patterned etching process. The through-hole H1 may expose the bottom conductive line 648 of the memory cell. Thereafter, the bottom electrode 140 of the memory cell 100 may be formed in the through-hole H1 using a deposition process and a planarization process.

In act 508, a memory layer 130 is formed on the bottom electrode 140. In some embodiments, the memory layer 130 is a phase change layer of a PCRAM cell PCRAM layer. In other embodiments, the memory layer 130 is a resistive-switching layer or a RRAM cell.

In act 510, a barrier electrode 144 is formed on the memory layer 130.

In act 512, a selector layer 160 is formed on the barrier electrode 144, wherein the selector layer 160 is formed by introducing an oxygen-containing gas into a process chamber during sputtering chalcogenide based targets in the same process chamber. In some embodiments, the oxygen-containing gas is continuously turned on during the formation of the selector layer. In other embodiments, the oxygen-containing gas is discontinuously turned on during the formation of the selector layer. In some embodiments, the PCRAM layer and the selector layer are formed from the same sputtering targets but the compositions thereof are different.

In act 514, a top electrode 142 is formed on the selector layer 160. In some embodiments, the act 408 and the act 410 are formed simultaneously. In some embodiments, the memory layer 130, the barrier electrode 144, the selector layer 160 and the top electrode 142 may be formed by using deposition processes and followed by photolithography and etching processes. In some embodiments, at least one of the memory layer 130 and the selector layer 160 has a narrow-middle profile in which the middle portion is narrower than the top portion and the bottom portion. The middle dielectric layer 650B is formed to surround the memory layer 130, the barrier electrode 144, the selector layer 160 and the top electrode 142.

In act 514, a top conductive line 458 is formed on the top electrode 142. In some embodiments, a top dielectric layer 650C may be formed on the middle dielectric layer 650B. In act 410, a through-hole H2 may be formed in the top dielectric layer 650C using a patterned etching process. The through-hole H2 may expose the top electrode 142 of the memory cell. Thereafter, the top conductive line 458 of the memory cell 100 may be formed in the through-hole H2 using a deposition process and a planarization process.

In some embodiments of the disclosure, by providing an oxygen-doped chalcogenide based film as a selector layer, the leak current of the memory device is reduced, without degrading the device endurance performance. For example, the VFF (forming voltage) is increased by 0.1-0.5% from about 2.08-2.1 V to about 2.55-2.60 V, and the leak current is decreased by 0.1-0.5% from about 10 nA to about 1 nA. The oxygen doping concentration can be detected by advanced apparatus such as XPS (X-ray photoelectron spectroscopy) or SIMS (Secondary ion mass spectrometry) with enhanced oxygen detection conditions.

According to an aspect of the present disclosure, a memory device includes a substrate, a bottom electrode disposed over the substrate, a memory layer disposed over the bottom electrode, a selector layer disposed over the memory layer, and a top electrode disposed over the selector layer. The selector layer is an oxygen-doped chalcogenide based film, and an oxygen content of the selector layer is about 10 at % or less.

According to an aspect of the present disclosure, a memory device includes a substrate, a bottom electrode disposed over the substrate, a top electrode disposed over the top electrode, and a selector layer and a phase change layer provided between the bottom electrode and the top electrode. The selector layer includes at least one first layer and at least one second layer in direct contact with each other, and an oxygen content of the at least one first layer is less than an oxygen content of the at least one second layer.

According to an aspect of the present disclosure, a method of forming a memory device includes: forming a transistor on a substrate; forming a bottom conductive line on the substrate; forming a bottom electrode on the bottom conductive line; forming a memory layer on the bottom electrode; forming a selector layer on the memory layer, wherein the selector layer is formed by introducing an oxygen-containing gas into a process chamber during sputtering chalcogenide based targets in the same process chamber; and forming a top electrode on the selector layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a substrate;

a bottom electrode disposed over the substrate;

a memory layer disposed over the bottom electrode;

a selector layer disposed over the memory layer; and a top electrode disposed over the selector layer, wherein the selector layer is an oxygen-doped chalcogenide based film, and an oxygen content of the selector layer is about 10 at % or less, and wherein the oxygen content of the selector layer is varied in a thickness direction extending between the bottom electrode and the top electrode.

2. The memory device of claim 1, wherein the selector layer comprises oxygen-doped GeCTe, oxygen-doped NGeCTe, oxygen-doped SiGeCTe, oxygen-doped NSiGeCTe, or a combination thereof.

3. The memory device of claim 1, wherein in a cross-section of the memory device along a stacking direction of the bottom electrode and the top electrode, sidewalls of the top electrode, sidewalls of the memory layer and sidewalls of the selector layer are substantially aligned, and the sidewalls of the top electrode are laterally offset from sidewalls of the bottom electrode.

4. The memory device of claim 1, wherein the memory layer is an oxygen-doped chalcogenide based film, and an oxygen content of the memory layer is about 10 at % or less.

5. The memory device of claim 1, wherein the memory layer is a phase change layer of a PCRAM cell.

6. The memory device of claim 1, wherein the memory layer is a resistive-switching layer or a RRAM cell.

7. The memory device of claim 1, further comprising a barrier layer between the selector layer and the memory layer.

8. A memory device, comprising:

a substrate;

a bottom electrode disposed over the substrate;

a top electrode disposed over the bottom electrode; and a selector layer and a phase change layer provided between the bottom electrode and the top electrode, wherein the selector layer comprises at least one first layer and at least one second layer in direct contact with each other, and an oxygen content of the at least one first layer is less than an oxygen content of the at least one second layer, wherein the oxygen content of the at least one first layer is less than about 0.1 at %.

9. The memory device of claim 8, wherein the oxygen content of the at least one second layer ranges from about 0.1 at % to 10 at %.

10. The memory device of claim 8, wherein the at least one first layer comprises GeCTe, NGeCTe, SiGeCTe, NSiGeCTe, or a combination thereof.

11. The memory device of claim 8, wherein the at least one second layer comprises oxygen-doped GeCTe, oxygen-doped NGeCTe, oxygen-doped SiGeCTe, oxygen-doped NSiGeCTe, or a combination thereof.

12. The memory device of claim 8, wherein the selector layer has a sandwich structure comprising two first layers and a second layer between the two first layers.

13. The memory device of claim 8, wherein the selector layer has a laminated structure comprising a plurality of the first layers and a plurality of the second layers alternately stacked.

14. The memory device of claim 13, wherein one of the plurality of the first layers is the uppermost layer of the laminated structure.

15. The memory device of claim 13, wherein one of the plurality of the first layers is the lowermost layer of the laminated structure.

16. The memory device of claim 8, wherein the selector layer is disposed between the bottom electrode and the memory layer.

17. The memory device of claim 8, wherein the selector layer is disposed between the top electrode and the memory layer.

18. The memory device of claim 8, further comprising:

a conductive line disposed over the top electrode; and a dielectric layer disposed along sidewalls of the conductive line and further extended onto a surface of the top electrode facing away from the bottom electrode.

19. A method of forming a memory device, comprising:

providing a substrate;

forming a bottom electrode over the substrate;

forming a memory layer over the bottom electrode;

forming a selector layer over the memory layer; and forming a top electrode over the selector layer, wherein the selector layer is an oxygen-doped chalcogenide based film, and an oxygen content of the selector layer is about 10 at % or less, and wherein the oxygen content of the selector layer is varied in a thickness direction extending between the bottom electrode and the top electrode.

20. The memory device of claim 19, wherein in a cross-section of the memory device along a stacking direction of the bottom electrode and the top electrode, sidewalls of the top electrode, sidewalls of the memory layer and sidewalls of the selector layer are substantially aligned, and the sidewalls of the top electrode are laterally offset from sidewalls of the bottom electrode.

* * * * *